United States Patent
Onuma et al.

(10) Patent No.: US 10,026,875 B2
(45) Date of Patent: Jul. 17, 2018

(54) LIGHT-SOURCE DEVICE AND LIGHT-EMITTING DEVICE

(71) Applicant: SHARP KABUSHIKI KAISHA, Osaka-shi, Osaka (JP)

(72) Inventors: Hiroaki Onuma, Osaka (JP); Tomokazu Nada, Osaka (JP); Yuta Homma, Osaka (JP); Toshio Hata, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 14/899,374

(22) PCT Filed: Jun. 16, 2014

(86) PCT No.: PCT/JP2014/065844
§ 371 (c)(1),
(2) Date: Dec. 17, 2015

(87) PCT Pub. No.: WO2014/203839
PCT Pub. Date: Dec. 24, 2014

(65) Prior Publication Data
US 2016/0149094 A1 May 26, 2016

(30) Foreign Application Priority Data

Jun. 18, 2013 (JP) .................................. 2013-127872

(51) Int. Cl.
- *H01L 33/50* (2010.01)
- *H01L 33/56* (2010.01)
- *H01L 25/075* (2006.01)

(52) U.S. Cl.
CPC ........ *H01L 33/504* (2013.01); *H01L 25/0753* (2013.01); *H01L 33/56* (2013.01); *H01L 2924/0002* (2013.01)

(58) Field of Classification Search
CPC ... H01L 33/504; H01L 33/56; H01L 25/0753; H01L 2924/0002
(Continued)

(56) References Cited

U.S. PATENT DOCUMENTS

| 5,851,063 A | 12/1998 | Doughty et al. |
|---|---|---|
| 2005/0269582 A1* | 12/2005 | Mueller ................. C04B 35/44 257/94 |

(Continued)

FOREIGN PATENT DOCUMENTS

| CN | 101150162 A | 3/2008 |
|---|---|---|
| CN | 102352970 A | 2/2012 |

(Continued)

OTHER PUBLICATIONS

International Search Report for PCT/JP2014/065844, dated Aug. 26, 2014, 4 pages.

(Continued)

*Primary Examiner* — Cuong Q Nguyen
*Assistant Examiner* — Tong-Ho Kim
(74) *Attorney, Agent, or Firm* — Nixon & Vanderhye P.C.

(57) ABSTRACT

In a light-source device (10) of this invention, integrated light emission intensity from 460 nm to 500 nm is higher than integrated light emission intensity from 415 nm to 460 nm in an emission spectrum of white light. This allows provision of a light-source device which emits white light easy on a human eye.

1 Claim, 8 Drawing Sheets

(58) Field of Classification Search
USPC .................................... 257/89, 88; 362/235
See application file for complete search history.

(56) References Cited

U.S. PATENT DOCUMENTS

| | | | |
|---|---|---|---|
| 2009/0194782 A1 | 8/2009 | Hata et al. | |
| 2011/0222264 A1 | 9/2011 | Matsuda et al. | |
| 2011/0222277 A1* | 9/2011 | Negley | H01L 33/504 362/235 |
| 2012/0112626 A1 | 5/2012 | Sakuta et al. | |
| 2013/0256705 A1* | 10/2013 | Huang | G02F 1/133615 257/88 |
| 2014/0027799 A1* | 1/2014 | Li | C09K 11/0883 257/89 |
| 2014/0098529 A1 | 4/2014 | Hata et al. | |
| 2015/0304614 A1* | 10/2015 | Hosoki | G09F 9/00 348/791 |
| 2017/0175972 A1 | 6/2017 | Hata et al. | |

FOREIGN PATENT DOCUMENTS

| | | |
|---|---|---|
| JP | 10-209504 A | 8/1998 |
| JP | 2008-34188 A | 2/2008 |
| JP | 2008-258356 | 10/2008 |
| JP | 2008-311532 | 12/2008 |
| JP | 2009-188201 | 8/2009 |
| JP | 2009-260390 | 11/2009 |
| JP | 2010-34184 | 2/2010 |
| JP | 2011-176276 | 9/2011 |
| JP | 2011-192703 | 9/2011 |
| JP | 2011-233635 A | 11/2011 |
| WO | 2012/165007 | 12/2012 |

OTHER PUBLICATIONS

Written Opinion of the ISA for PCT/JP2014/065844, dated Aug. 26, 2014, 4 pages.
Japanese Office Action dated Jul. 12, 2016 in Japanese Patent Application 2015-522900.

* cited by examiner

LIGHT-SOURCE DEVICE AND LIGHT-EMITTING DEVICE

This application is the U.S. national phase of International Application No. PCT/JP2014/065844 filed 16 Jun. 2014, which designated the U.S. and claims priority to JP Patent Application No. 2013-127872 filed 18 Jun. 2013, the entire contents of each of which are hereby incorporated by reference.

TECHNICAL FIELD

The present invention relates to a light-source device and a light-emitting device using a light emitting diode (LED).

BACKGROUND ART

Adoption of an LED as a light source for general illumination or a backlight light source for a display is being rapidly pursued as environmental countermeasures against global warming. An LED illumination module configured to emit white light is used as such a light source. Examples of a method for generating white light using an LED include the method of generating white light by combining three primary colors of light using three types of LEDs, a red LED, a blue LED, and a green LED, and the method of generating white light by mixing blue light and yellow light using a blue LED as a light source for a yellow phosphor.

For example, PTL 1 discloses an illumination light source which excites a yellow phosphor, a green phosphor, and a red phosphor using two types of blue LEDs different in peak wavelength to emit white light. Additionally, an illumination device is formed by arranging a plurality of different LED packages in PTL 1.

PTL 2 discloses a light-emitting device which emits white light using a blue LED element sealed in a transparent resin containing a phosphor and a red LED element sealed in a transparent resin containing no phosphor.

CITATION LIST

Patent Literature

PTL 1: Japanese Unexamined Patent Application Publication No. 2008-258356 (laid open on Oct. 23, 2008)
PTL 2: Japanese Unexamined Patent Application Publication No. 2011-192703 (laid open on Sep. 29, 2011)

SUMMARY OF INVENTION

Technical Problem

Light with a wavelength of 415 nm to 460 nm among blue components included in white light from an LED as a light source has a large impact on (poses a high degree of hazard to) the retina of a human eye. For example, in the blue light hazard function (JIS T7330) used as an indicator of adverse impacts of blue light emitted by a blue light emitting diode on the retina of a human eye, if the degree of hazard is 1 (the maximum) for a wavelength of 440 nm, the degree of hazard is 0.80 for a wavelength of 415 nm, 0.95 for a wavelength of 425 nm, 0.94 for a wavelength of 450 nm, 0.80 for a wavelength of 460 nm, and 0.62 for a wavelength of 470 nm. It can be said that a smaller numerical value indicates a higher degree of easiness on the eyes.

However, conventional light sources and light-emitting devices using an LED are all intended to enhance emission efficiency and have no special regard for impacts on the retina of a human eye. A blue component close to 450 nm, for which the blue light hazard function has a large value, is contained in white light from every one of the conventional devices.

The present invention has been made in view of the above-described problem and has as its object to provide a light-source device and a light-emitting device which emit white light easy on a human eye using blue light, for which the blue light hazard function has a small value.

Solution to Problem

In order to solve the above-described problem, a light-source device according to one aspect of the present invention is a light-source device which emits white light using a light emitting diode, in which integrated light emission intensity from 460 nm to 500 nm is higher than integrated light emission intensity from 415 nm to 460 nm in an emission spectrum of the white light.

Advantageous Effects of Invention

According to the one aspect of the present invention, a main blue component of white light is light of 460 nm to 500 nm, which has the prominent effect of allowing provision of a light-source device which emits white light easy on a human eye.

BRIEF DESCRIPTION OF DRAWINGS

FIG. 5(a) is a plan view, and FIG. 5(b) is a cross-sectional view on arrow D-D in FIG. 5(a).

FIG. 6(a) is a plan view, and FIG. 6(b) is a cross-sectional view on arrow E-E in FIG. 6(a).

DESCRIPTION OF EMBODIMENTS

[First Embodiment]

Figure 1:
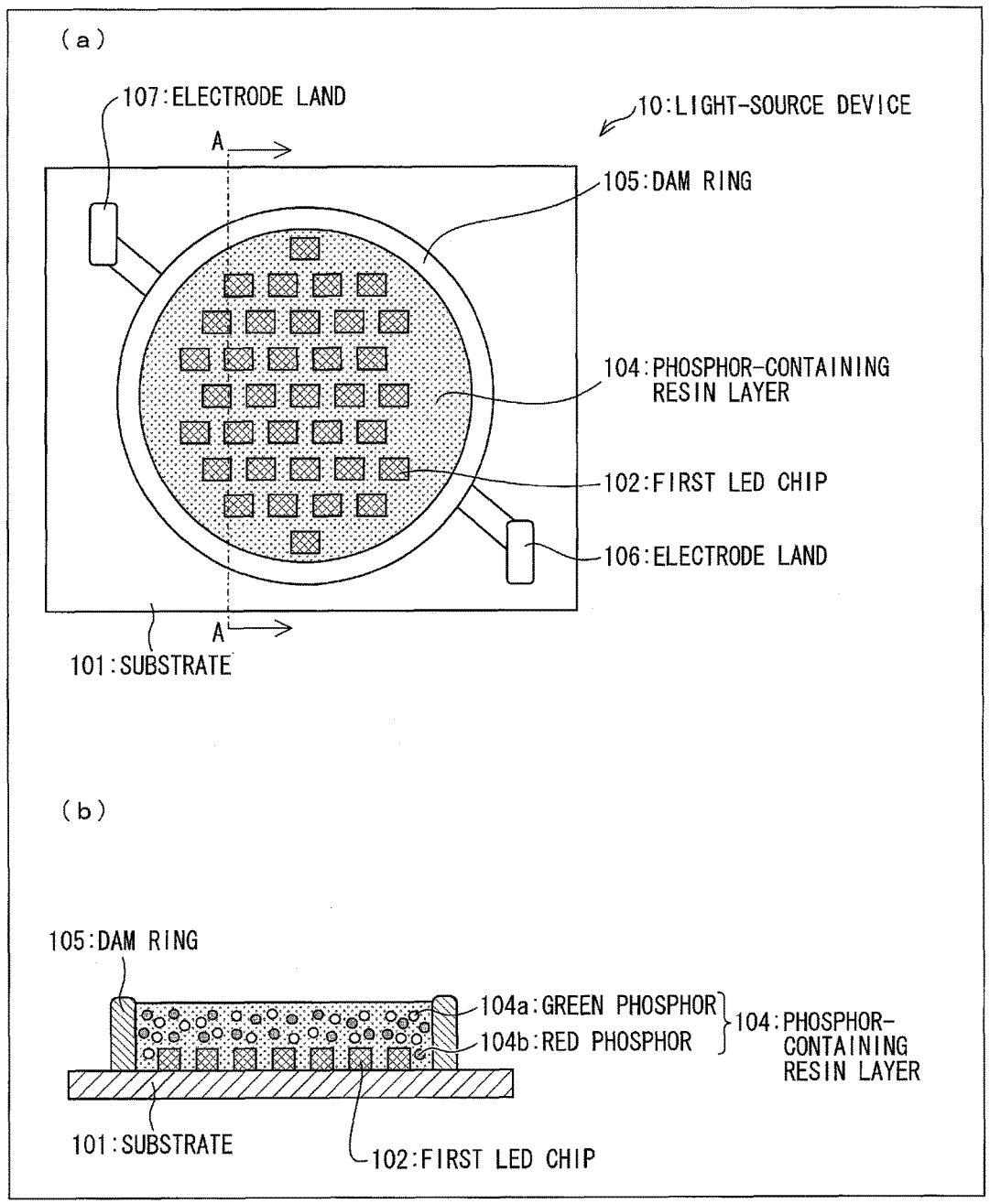
FIG. 1(a) is a plan view showing an example of the configuration of a light-emitting surface of a light-source device according to a first embodiment of the present invention.
FIG. 1(b) is a cross-sectional view on arrow A-A shown in FIG. 1(a).

One embodiment of the present invention will be described as follows.

(Basic Configuration of Light-Source Device)

FIG. 1(a) is a plan view showing one example of the configuration of a light-source device 10 according to the present embodiment, and FIG. 1(b) is a cross-section on arrow A-A in FIG. 1(a).

As shown in FIG. 1(a), the light-source device 10 includes a substrate 101, a first LED chip 102 (first light emitting diode), a phosphor-containing resin layer (phosphor-containing sealing resin) 104, and a dam ring 105 (resinous frame).

The substrate 101 is a substrate made of ceramic. The substrate 101 has a rectangular shape in a plan view. One surface (hereinafter referred to as an upper surface) of the substrate 101 is provided with the first LED chips 102 (first light emitting diodes), the phosphor-containing resin layer 104, and the dam ring 105 (resinous frame) described above. In addition, electrode lands 106 and 107 for external connection are formed.

The electrode land 106 functions as an anode electrode while the electrode land 107 functions as a cathode electrode. The electrode lands 106 and 107 are arranged outside a region surrounded by the dam ring 105 of the upper surface of the substrate 101 and near two corners, respectively, of the upper surface. Surfaces of the electrode lands 106 and 107 are exposed so as to be connectable to an external terminal.

The first LED chips 102 are each composed of a blue light emitting diode and are electrically connected to wiring (not shown), and the wiring is connected to the electrode lands 106 and 107. With this configuration, the electrode lands 106 and 107 are connected to each other via the first LED chips 102 such that the first LED chips 102 can emit light. The details of the first LED chip 102 will be described later.

As shown in FIG. 1(b), the phosphor-containing resin layer 104 is a sealing resin layer made of a resin containing a green phosphor 104a (divalent europium-activated β-SiAlON) and a red phosphor 104b ($Sr_xCa_{1-x}AlSiN_3:Eu^{2+}$). The region surrounded by the dam ring 105 is filled with the phosphor-containing resin layer 104, which is formed so as to bury the first LED chips 102 arranged in the region. That is, the phosphor-containing resin layer 104 collectively seals in the first LED chips 102.

The green phosphor 104a and the red phosphor 104b are not limited to the above-described phosphors and may be the phosphors illustrated below. A combination of LED chips and phosphors to be used in a light-source device is preferably selected in view of phosphor excitation characteristics such that conditions are optimum. Additionally, one of a green phosphor and a red phosphor may be omitted or a plurality of green phosphors and a plurality of red phosphors may be simultaneously used.

(Green Phosphor 104a)

(1) A divalent europium-activated oxynitride phosphor which is β-SiAlON substantially represented by $Eu_aSi_bAl_cO_dN_e$.

(2) A trivalent cerium-activated oxide phosphor having a garnet structure which is represented by $MI_{3-x}Ce_xMII_5O_{12}$, where MI is at least one element selected from the group consisting of Lu, Y, La, and Gd, and MII is at least one element selected from the group consisting of Al and Ga.

(3) A divalent europium-activated silicate phosphor which is represented by $MIII_{2-x}Eu_xSiO_4$, where MIII is at least one element selected from the group consisting of Mg, Ca, Sr, and Ba.

(4) A trivalent cerium-activated silicate phosphor which is substantially represented by $MIII_{3-x}Ce_xMIV_2Si_3O_{12}$, where MIII is at least one element selected from the group consisting of Mg, Ca, Sr, and Ba, and MIV is at least one element selected from the group consisting of Li, Na, K, Cs, Rb, Mg, Ca, Ba, Al, Ga, In, Sc, Y, La, Gd, and Lu. (5) A trivalent cerium-activated nitride phosphor which is represented by $MI_{3-x}Ce_xSi_6N_{11}$ and is at least one element selected from the group consisting of Lu, Y, La, and Gd.

(Red Phosphor 104b)

(1) A divalent europium-activated nitride phosphor which is represented by $MIII_{1-x}Eu_xMVSiN_3$, where MIII is at least one element selected from the group consisting of Mg, Ca, Sr, and Ba, and MV is at least one element selected from the group consisting of Al, Ga, In, Sc, Y, La, Gd, and Lu.

(2) A divalent europium-activated nitride phosphor which is represented by $MIII_{2-x}Eu_xSi_5N_8$, where MIII is at least one element selected from the group consisting of Mg, Ca, Sr, and Ba.

(3) A divalent europium-activated oxynitride phosphor which is substantially represented by $Eu_fMVI_gSi_hAl_iO_jN_k$, where MVI is α-SiAlON which is at least one element selected from the group consisting of Li, Na, K, Rb, Cs, Mg, Ca, Sr, Ba, Sc, Y, La, and Gd.

(4) A tetravalent manganese-activated metal fluoride salt phosphor which is represented by $MVII_2(MVIII_{1-x}Mn_x)F_6$, where MVII is at least one element selected from the group consisting of Li, Na, K, Rb, and Cs, and MVIII is at least one element selected from the group consisting of Ge, Si, Sn, Ti, and Zr.

The dam ring 105 is a member which defines the phosphor-containing resin layer 104 described above. That is, the dam ring 105 functions as a dam (damming member) for preventing resin leakage at the time of formation of the phosphor-containing resin layer 104.

(Configuration of LED Chip)

The first LED chip 102 is a blue light emitting diode with a peak wavelength within a range of 460 nm to 500 nm (470-nm chip). In the present embodiment, a blue light emitting diode with a peak wavelength within a range of 415 nm to 460 nm (450-nm chip) is not used.

In other words, the first LED chip 102 has a peak wavelength within the range of 460 nm to 500 nm. Blue light obtained through light emission by the first LED chip 102 is used to produce white light. That is, blue light obtained through light emission by the first LED chip 102 serves as a blue component of white light emitted from the light-source device 10.

Blue light obtained through light emission by the first LED chip 102 excites the green phosphor 104a and the red phosphor 104b contained in the phosphor-containing resin layer 104 described above to produce green light and red light. That is, blue light obtained through light emission by the first LED chip 102 also serves as a red component and a green component of white light emitted from the light-source device 10 through excitation of and light emission by the phosphors.

The degree of hazard for 460 nm that is a lower limit value (critical value) of a peak wavelength range of the first LED chip 102 is 80% of the highest degree of hazard for a wavelength of 440 nm. The degree of hazard higher than 80% is highly likely to have an adverse impact on the retina of a human eye. The lower limit value of the peak wavelength range of the first LED chip 102 is preferably 460 nm.

An upper limit value of the peak wavelength range of the first LED chip 102, 500 nm, is an upper limit for a blue component of white light.

(Arrangement of LED Chip)

As shown in FIG. 1(a), the first LED chips 102 are arranged at even intervals inside the dam ring 105. This configuration makes it easier for colors of light emitted by the first LED chips 102 to be uniformly mixed and allows a reduction in unevenness in luminance. Note that the arrangement of the first LED chips 102 is not limited to the arrangement as in FIG. 1(a).

(Advantageous Effects of First Embodiment)

As described above, the light-source device 10 according to the present embodiment does not use a blue light emitting diode with a peak wavelength within the range of 415 nm to 460 nm which poses a high degree of hazard to a human eye, and the light-source device 10 is implemented using the first LED chip 102, a blue component of white light emitted by which has a peak wavelength range (460 nm to 500 nm) that poses a low degree of hazard and is easy on a human eye. Thus, the light-source device 10 can emit white light easy on a human eye.

The second embodiment below will describe an example where color components are obtained not through excitation of phosphors but through light emission by LED chips of respective colors (three colors).

[Second Embodiment]

Another embodiment of the present invention will be described as follows. Note that members having same functions as in the first embodiment are denoted by same reference numerals, and a detailed description thereof will be omitted.

(Basic Configuration of Light-Source Device)

FIG. 2(a) is a plan view showing one example of the configuration of a light-source device 20 according to the present embodiment, and FIG. 2(b) is a cross-section on arrow B-B in FIG. 2(a).

As shown in FIG. 2(a), in the light-source device 20, a dam ring 105, an electrode land 106, and an electrode land 107 are formed on a substrate 101, a blue chip 131, a red chip (red light emitting diode) 132, and a green chip (green light emitting diode) 133 are provided instead of the first LED chip 102 and the second LED chip 103 according to the first embodiment, and a transparent sealing resin layer 134 is formed instead of the phosphor-containing resin layer 104 according to the first embodiment. That is, the green chip 133 is a green light emitting diode which emits green light used at the time of emission of white light, and the red chip 132 is a red light emitting diode which emits red light used at the time of emission of white light.

As shown in FIG. 2(b), a region surrounded by the dam ring 105 on the substrate 101 is filled with the transparent sealing resin layer 134, which is formed so as to bury the blue chips 131, the red chips 132, and the green chips 133 arranged in the region.

A light emitting diode with a peak wavelength of 460 nm to 500 nm which is the same as that of the first LED chip 102 is used as the blue chip 131.

A light emitting diode with a peak wavelength of 580 nm to 680 nm is used as the red chip 132.

A light emitting diode with a peak wavelength of 500 nm to 580 nm is used as the green chip 133.

(Advantageous Effects of Second Embodiment)

As described above, the present embodiment does not use a blue light emitting diode with a peak wavelength of 415 nm to 460 nm which has an adverse impact on the retina of a human eye, like the first embodiment. White light to be emitted has no wavelength component which poses a high degree of hazard.

Additionally, the lack of the need for use of a phosphor saves the trouble of kneading resin with a phosphor, which has the effect of facilitating manufacture of a light-source device.

The first and second embodiments have both described an example where a blue light emitting diode with a peak wavelength of 415 nm to 460 nm which has an adverse impact on the retina of a human eye is not used. The third to fifth embodiments below will describe an example of a light-source device in which a blue light emitting diode (450-nm chip) with a peak wavelength within a range of 415 nm to 460 nm is provided in addition to a blue light emitting diode (470-nm chip) with a peak wavelength within a range of 460 nm to 500 nm in terms of enhancing white light emission efficiency as well as reducing adverse impacts on the retina of a human eye with a simple configuration.

Note that the third to fifth embodiments below each use a 470-nm chip and a 450-nm chip and that 470-nm and 450-nm chips are used such that integrated light emission intensity from 460 nm to 500 nm is higher than integrated light emission intensity from 415 nm to 460 nm in an emission spectrum of white light emitted by a light-source device. This configuration allows minimization of adverse impacts of 450-nm chips on a human eye. In the first and second embodiments without use of a 450-nm chip, integrated light emission intensity from 460 nm to 500 nm is, of course, higher than integrated light emission intensity from 415 nm to 460 nm in an emission spectrum of white light emitted by a light-source device. Although blue LED chips having emission wavelengths of 450 nm and 470 nm are illustrated as practical examples, chip wavelengths are not limited to these. Additionally, $Lu_3Al_5O_{12}:Ce^{3+}$ is illustrated as a practical example of a green phosphor, and $Sr_xCa_{1-x}AlSiN_3:Eu^{2+}$ is described as a practical example of a red phosphor. Phosphors, however, are not limited to these.

[Third Embodiment]

Still another embodiment of the present invention will be described as follows. Note that members having same functions as in the first embodiment are denoted by same reference numerals, and a detailed description thereof will be omitted.

(Basic Configuration of Light-Source Device)

FIG. 3(a) is a plan view showing one example of the configuration of a light-source device 30 according to the present embodiment, and FIG. 3(b) is a cross-section on arrow C-C in FIG. 3(a).

As shown in FIG. 3(a), the light-source device 30 includes a substrate 101, a first LED chip 102 (first light emitting diode), a second LED chip 103 (second light emitting diode), a phosphor-containing resin layer 104, and a dam ring 105 (resinous frame).

The substrate 101 is a substrate made of ceramic. The substrate 101 has a rectangular shape in a plan view. One surface (hereinafter referred to as an upper surface) of the substrate 101 is provided with the first LED chips 102 (first light emitting diodes), the second LED chips 103 (second light emitting diodes), the phosphor-containing resin layer 104, and the dam ring 105 (resinous frame) described above. In addition, electrode lands 106 and 107 for external connection are formed.

The electrode land 106 functions as an anode electrode while the electrode land 107 functions as a cathode electrode. The electrode lands 106 and 107 are arranged outside a region surrounded by the dam ring 105 of the upper surface of the substrate 101 and near two corners, respectively, of the upper surface. Surfaces of the electrode lands 106 and 107 are exposed so as to be connectable to an external terminal.

The first LED chips 102 and the second LED chips 103 are each composed of a blue light emitting diode and are electrically connected to wiring (not shown), and the wiring is connected to the electrode lands 106 and 107. With this configuration, the electrode lands 106 and 107 are connected to each other via the first LED chips 102 and the second LED chips 103 such that the first LED chips 102 and the second LED chips 103 can emit light. The details of the first LED chip 102 and the second LED chip 103 will be described later.

As shown in FIG. 3(b), the phosphor-containing resin layer 104 is a sealing resin layer made of a resin containing a green phosphor 104a ($Lu_3Al_5O_{12}$: $Ce^{3+}$) and a red phosphor 104b ($Sr_xCa_{1-x}AlSiN_3$:$Eu^{2+}$). The region surrounded by the dam ring 105 is filled with the phosphor-containing resin layer 104, which is formed so as to bury the first LED chips 102 and the second LED chips 103 arranged in the region. That is, the phosphor-containing resin layer 104 collectively seals in the first LED chips 102 and the second LED chips 103.

The green phosphor 104a and the red phosphor 104b are not limited to the above-described phosphors and may be the phosphors illustrated below. A combination of LED chips and phosphors to be used in a light-source device is preferably selected in view of phosphor excitation characteristics such that conditions are optimum. Additionally, one of a green phosphor and a red phosphor may be omitted or a plurality of green phosphors and a plurality of red phosphors may be simultaneously used.

(Green Phosphor 104a)

(1) A divalent europium-activated oxynitride phosphor which is β-SiAlON substantially represented by $Eu_aSi_bAl_cO_dN_e$.

(2) A trivalent cerium-activated oxide phosphor having a garnet structure which is represented by $MI_{3-x}Ce_xMII_5O_{12}$, where MI is at least one element selected from the group consisting of Lu, Y, La, and Gd, and MII is at least one element selected from the group consisting of Al and Ga.

(3) A divalent europium-activated silicate phosphor which is represented by $MIII_{2-x}Eu_xSiO_4$, where MIII is at least one element selected from the group consisting of Mg, Ca, Sr, and Ba.

(4) A trivalent cerium-activated silicate phosphor which is substantially represented by $MIII_{3-x}Ce_xMIV_2Si_3O_{12}$, where MIII is at least one element selected from the group consisting of Mg, Ca, Sr, and Ba, and MIV is at least one element selected from the group consisting of Li, Na, K, Cs, Rb, Mg, Ca, Ba, Al, Ga, In, Sc, Y, La, Gd, and Lu.

(5) A trivalent cerium-activated nitride phosphor which is represented by $MI_{3-x}Ce_xSi_6N_{11}$ and is at least one element selected from the group consisting of Lu, Y, La, and Gd.

(Red Phosphor 104b)

(1) A divalent europium-activated nitride phosphor which is substantially represented by $MIII_{1-x}Eu_xMVSiN_3$, where MIII is at least one element selected from the group consisting of Mg, Ca, Sr, and Ba, and MV is at least one element selected from the group consisting of Al, Ga, In, Sc, Y, La, Gd, and Lu.

(2) A divalent europium-activated nitride phosphor which is substantially represented by $MIII_{2-x}Eu_xSi_5N_8$, where MIII is at least one element selected from the group consisting of Mg, Ca, Sr, and Ba.

(3) A divalent europium-activated oxynitride phosphor which is substantially represented by $Eu_fMVI_gSi_hAl_iO_jN_k$, where MVI is α-SiAlON which is at least one element selected from the group consisting of Li, Na, K, Rb, Cs, Mg, Ca, Sr, Ba, Sc, Y, La, and Gd.

(4) A tetravalent manganese-activated metal fluoride salt phosphor which is substantially represented by $MVII_2(MVIII_{1-x}Mn_x)F_6$, where MVII is at least one alkali metal element selected from the group consisting of Li, Na, K, Rb, and Cs, and MVIII is at least one element selected from the group consisting of Ge, Si, Sn, Ti, and Zr.

The dam ring 105 is a member which defines the phosphor-containing resin layer 104. That is, the dam ring 105 functions as a dam (damming member) for preventing resin leakage at the time of formation of the phosphor-containing resin layer 104.

(Configuration of LED Chip)

The first LED chip 102 and the second LED chip 103 are both blue light emitting diodes. The first LED chip 102 and the second LED chip 103 are different in peak wavelength and in how emitted blue light is used.

The first LED chip 102 is a blue light emitting diode with a peak wavelength within a range of 460 nm to 500 nm (470-nm chip). Blue light obtained through light emission by the first LED chip 102 is used to produce white light. That is, blue light obtained through light emission by the first LED chip 102 serves as a blue component of white light emitted from the light-source device 30.

The second LED chip 103 is a blue light emitting diode with a peak wavelength within a range of 415 nm to 460 nm (450-nm chip). Blue light obtained through light emission by the second LED chip 103 excites the green phosphor 104a and the red phosphor 104b contained in the phosphor-containing resin layer 104 (to be described later) to produce green light and red light. That is, blue light obtained through light emission by the second LED chip 103 serves as a red component and a green component of white light emitted from the light-source device 10.

Note that part of blue light obtained through light emission by the first LED chip 102 is used as excitation light for excitation of the green phosphor 104a and the red phosphor 104b.

The degree of hazard for 460 nm that is a lower limit value (critical value) of a peak wavelength range of the first LED chip 102 is 80% of the highest degree of hazard for a wavelength of 440 nm. The degree of hazard higher than 80% is highly likely to have an adverse impact on the retina of a human eye. The lower limit value of the peak wavelength range of the first LED chip 102 is preferably 460 nm.

An upper limit value of the peak wavelength range of the first LED chip 102, 500 nm, is an upper limit for a blue component of white light.

A peak wavelength range of the second LED chip 103 is set in accordance with the types of phosphors to be excited.

(Arrangement of LED Chip)

As shown in FIG. 3(a), the first LED chips 102 and the second LED chips 103 are arranged in alternating rows. However, arrangement positions of the first LED chips 102 and the second LED chips 103 are not particularly limited as long as the arrangement positions are inside the dam ring 105 formed on the substrate 101. From the perspective of color mixing, however, the first LED chips 102 and the second LED chips 103 are desirably arranged alternately at even intervals. The arrangement (the number and alignment) of the first LED chips 102 and 103 is not limited to the arrangement shown in FIG. 3(a).

Note that although the first LED chips 102 and the second LED chips 103 are not particularly limited to the above-described ones, the first LED chips 102 and the second LED chips 103 at least need to be arranged such that integrated light emission intensity from 460 nm to 500 nm is higher than integrated light emission intensity from 415 nm to 460 nm in an emission spectrum of the light-source device 30.

(Advantageous Effects of Third Embodiment)

As described above, the light-source device 30 according to the present embodiment is implemented using the first LED chip 102, a blue component of white light emitted by which has a peak wavelength range that poses a low degree of hazard and is easy on a human eye. Thus, the light-source device 30 can emit white light easy on a human eye. Additionally, the second LED chip 103 having the peak wavelength range with high excitation efficiency for a phosphor is used. Since components constituting white light except a blue component, that is, a red component and a green component can be efficiently obtained, white light can be emitted with high efficiency.

In the present embodiment, the first LED chips 102 and the second LED chips 103 are collectively sealed in a phosphor-containing resin into which a red phosphor and a green phosphor are kneaded. That is, the first LED chips 102 and the second LED chips 103 are sealed in the same resin.

Note that the first LED chips 102 and the second LED chips 103 may be sealed in different types of resins. The fourth embodiment below will illustrate an example where the first LED chips 102 and the second LED chips 103 are sealed in different types of resins.

[Fourth Embodiment]

Still another embodiment of the present invention will be described as follows. Note that a light-source device according to the present embodiment is identical in basic configuration to the light-source device 30 according to the third embodiment and is different in that the types of resins to seal in LED chips are different.

(Basic Configuration of Light-Source Device Before Resin Sealing)

Figure 4:
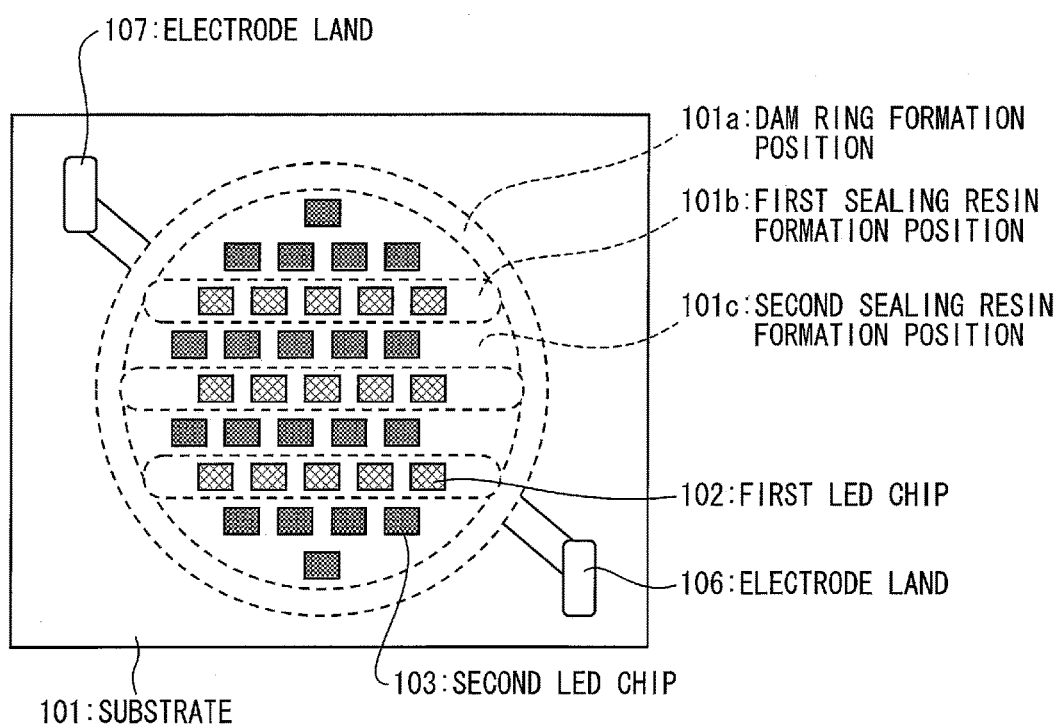
FIG. 4 is a plan view showing a sealing resin formation position on a substrate at a light-emitting surface of a light-source device according to a fourth embodiment of the present invention.

FIG. 4 is a plan view showing a state before resin sealing in a light-source device according to the present embodiment.

As shown in FIG. 4, a first LED chip 102, a second LED chip 103, an electrode land 106, and an electrode land 107 are provided on a substrate 101 before resin sealing. A doughnut-shaped dam ring formation position 101a for formation of a dam ring 105 and a first sealing resin formation position 101b around the first LED chips 102 are set on the substrate 101. A second sealing resin formation position 101c around the second LED chips 103 is set in a region other than regions, in which the first sealing resin formation positions 101b are set, inside the dam ring formation position 101a.

As a result of forming a resin at each resin formation position, the first LED chips 102 and the second LED chips 103 are sealed in different types of resins, like a light-source device 40 shown in FIGS. 5(a) and 5(b) and a light-source device 50 shown in FIGS. 6(a) and 6(b).

(Sealing Resin)

In the light-source device 40 shown in FIG. 5(a), a first sealing resin layer 111 is formed using a transparent, highly thixotropic resin as a resin to seal in the first LED chip 102, and a second sealing resin device 112 is formed using a resin into which a red phosphor and a green phosphor are kneaded as a resin to seal in the second LED chip 103.

The first sealing resin layers 111 made of the highly thixotropic resin are first formed so as to cover the first LED chips, and the second sealing resin layers 112 are then formed so as to cover the second LED chips 103. With this formation, a space immediately above the first LED chip 102 is covered with the transparent first sealing resin layer 111, and a space immediately above the second LED chip 103 is covered with the second sealing resin layer 112 containing a green phosphor 112a and a red phosphor 112b, as shown in FIG. 5(b).

Figure 5:
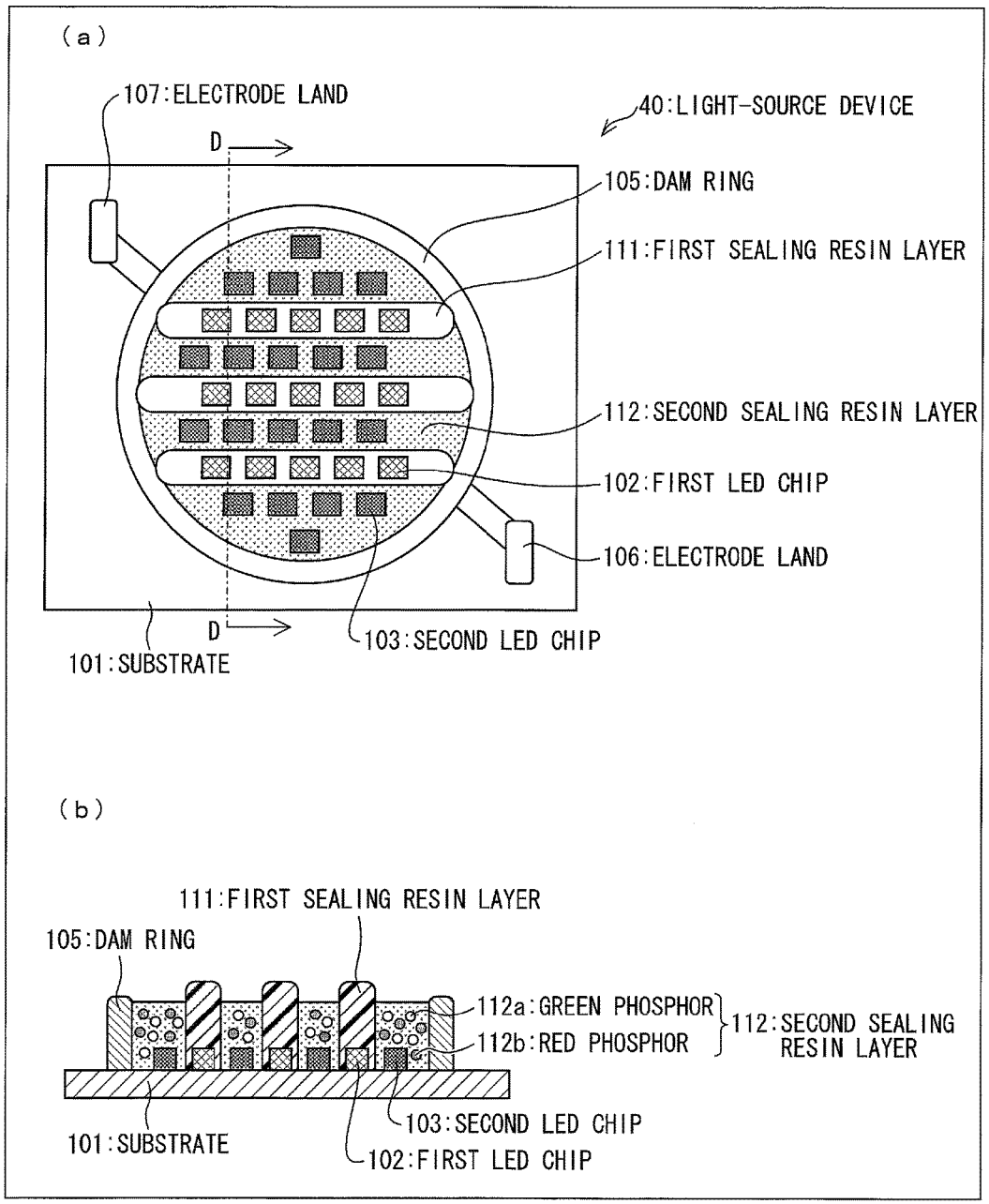
FIG. 5 shows a light-source device with a sealing resin formed on the substrate shown in FIG. 4.

In the example in FIG. 5, a resin containing no phosphor is used as a resin to seal in the first LED chip 102. The present invention, however, is not limited to this. A resin containing a phosphor may be used as the resin to seal in the first LED chip 102.

In the light-source device 50 shown in FIG. 6(a), a first sealing resin layer 121 is formed using a highly thixotropic resin, into which a red phosphor is kneaded, as a resin to seal in the first LED chip 102, and a second sealing resin device 122 is formed using a resin, into which a green phosphor is kneaded, as a resin to seal in the second LED chip 103.

As shown in FIG. 6(b), a space immediately above the first LED chip 102 is covered with the first sealing resin layer 121 containing a red phosphor 121a, and a space immediately above the second LED chip 103 is covered with the second sealing resin layer 122 containing a green phosphor 122a.

In the present embodiment, the red phosphors 112b and 121a are both $Sr_xCa_{1-x}AlSiN_3$: $Eu^{2+}$, and $Lu_3Al_5O_{12}$: $Ce^{3+}$ is used as the green phosphors 112a and 122a. The materials for the phosphors, however, are not particularly limited and may be determined depending on peak wavelength ranges of the first LED chip 102 and the second LED chip 103 so as to achieve higher excitation efficiency. In the present embodiment, phosphors and a resin to seal in the first LED chip 102 and phosphors and a resin to seal in the second LED chip 103 are determined in view of the fact that excitation efficiency for $Lu_3Al_5O_{12}$: $Ce^{3+}$ as a green phosphor is lower in the case of 470 nm than in the case of 450 nm, and excitation efficiency for $Sr_xCa_{1-x}AlSiN_3$: $Eu^{2+}$ as a red phosphor in the case of 470 nm is little different from that in the case of 450 nm. That is, as for in which one of the sealing resin layers 111 and 112 and the sealing resin layers 121 and 122 a green phosphor and a red phosphor are to be sealed, selection of a phosphor material and determination of a phosphor sealing position are preferably performed in view of an LED chip wavelength to be used in a light-source device and phosphor excitation characteristics. If 450 nm and 470 nm are adopted as LED chip wavelengths, and $MI_{3-x}Ce_xMII_5O_{12}$ and $MIII_{1-x}Eu_xMIVSiN_3$ are used as a green phosphor and a red phosphor, respectively, as in the present embodiment, the phosphors are preferably sealed in in a manner as illustrated in the present embodiment.

The green phosphors 112a and 122a and the red phosphors 112b and 121a are not limited to the above-described phosphors and may be the phosphors illustrated below. A combination of LED chips and phosphors to be used in a light-source device is preferably selected in view of phosphor excitation characteristics such that conditions are optimum. Additionally, one of a green phosphor and a red phosphor may be omitted or a plurality of green phosphors and a plurality of red phosphors may be simultaneously used.

(Green Phosphors 112a and 122a)

(1) A divalent europium-activated oxynitride phosphor which is β-SiAlON substantially represented by $Eu_aSi_bAl_cO_dN_e$.

(2) A trivalent cerium-activated oxide phosphor having a garnet structure which is represented by $MI_{3-x}Ce_xMII_5O_{12}$, where MI is at least one element selected from the group consisting of Lu, Y, La, and Gd, and MiI is at least one element selected from the group consisting of Al and Ga.

(3) A divalent europium-activated silicate phosphor which is represented by $MIII_{2-x}Eu_xSiO_4$, where MIII is at least one element selected from the group consisting of Mg, Ca, Sr, and Ba.

(4) A trivalent cerium-activated silicate phosphor which is substantially represented by $MIII_{3-x}Ce_xMIV_2Si_3O_{12}$, where MIII is at least one element selected from the group consisting of Mg, Ca, Sr, and Ba, and MIV is at least one element selected from the group consisting of Li, Na, K, Cs, Rb, Mg, Ca, Ba, Al, Ga, In, Sc, Y, La, Gd, and Lu.

(5) A trivalent cerium-activated nitride phosphor which is represented by $MI_{3-x}Ce_xSi_6N_{11}$ and is at least one element selected from the group consisting of Lu, Y, La, and Gd.

(Red Phosphors 112b and 121a)

(1) A divalent europium-activated nitride phosphor which is substantially represented by $MIII_{1-x}Eu_xMVSiN_3$, where MIII is at least one element selected from the group consisting of Mg, Ca, Sr, and Ba, and MV is at least one element selected from the group consisting of Al, Ga, In, Sc, Y, La, Gd, and Lu.

(2) A divalent europium-activated nitride phosphor which is substantially represented by $MIII_{2-x}Eu_xSi_5N_8$, where MIII is at least one element selected from the group consisting of Mg, Ca, Sr, and Ba.

(3) A divalent europium-activated oxynitride phosphor which is substantially represented by $Eu_fMVI_gSi_hAl_iO_jN_k$, where MVI is α-SiAlON which is at least one element selected from the group consisting of Li, Na, K, Rb, Cs, Mg, Ca, Sr, Ba, Sc, Y, La, and Gd.

(4) A tetravalent manganese-activated metal fluoride salt phosphor which is substantially represented by $MVII_2(MVIII_{1-x}Mn_x)F_6$, where MVII is at least one alkali metal element selected from the group consisting of Li, Na, K, Rb, and Cs, and MVIII is at least one element selected from the group consisting of Ge, Si, Sn, Ti, and Zr.

(Advantageous Effects of Fourth Embodiment)

The light-source devices 40 and 50 according to the present embodiment both include the first LED chip 102 (with a peak wavelength range of 460 nm to 500 nm), like the first to third embodiments. The light-source devices 40 and 50 can emit white light easy on a human eye.

Note that the present embodiment uses a highly thixotropic resin as a resin to seal in the first LED chip 102 and has the advantageous effect below. That is, if one LED chip (either the first LED chip 102 or the second LED chip 103) is sealed using a highly thixotropic resin, the other LED chip can be sealed through drawing using an air dispenser or the like. As described above, after only a specific site is sealed in a highly thixotropic resin, and the highly thixotropic resin is temporarily cured (the highly thixotropic resin is to function as a new dam ring at the time of sealing of the second LED chip 103), a region inside the annular dam ring may be sealed off with a less-thixotropic resin into which a phosphor is kneaded.

Note that although a highly thixotropic resin is used only as a resin to seal in the first LED chip 102 in the present embodiment, the use is not limited to this. A highly thixotropic resin may be used as a resin to seal in the second LED chip 103. Alternatively, a highly thixotropic resin may be used only as the resin to seal in the second LED chip 103, and a resin less thixotropic than the resin to seal in the second LED chip 103 may be used as the resin to seal in the first LED chip 102.

In each of the above-described embodiments, all LED chips formed on the substrate 101 are driven using input of one system, that is, the electrode land 106 functioning as an anode electrode and the electrode land 107 functioning as a cathode electrode. The present invention, however, is not limited to this, and all LED chips may be driven using input of two systems. An example of inputs of two systems will be illustrated in the fifth embodiment below.

[Fifth Embodiment]

Still another embodiment of the present invention will be described as follows.

Figure 7:
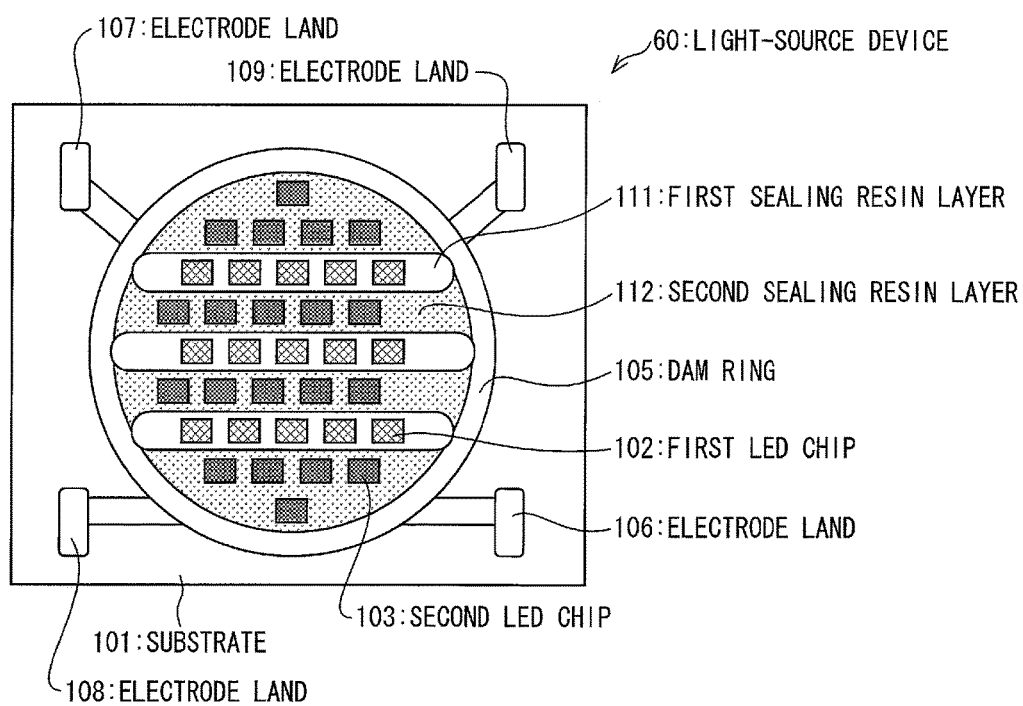
FIG. 7 is a plan view showing an example of the configuration of a light-emitting surface of a light-source device according to a fifth embodiment of the present invention.

FIG. 7 is a plan view showing one example of the configuration of a light-source device 60 according to the present embodiment.

The light-source device 60 has almost the same configuration as the light-source device 40 shown in FIG. 5(a) according to the third embodiment and is further provided with an electrode land 108 functioning as an anode electrode and an electrode land 109 functioning as a cathode electrode. Thus, the light-source device 50 has a configuration which implements input of two systems.

Components other than the electrode lands 108 and 109 of the light-source device 60 are the same as those of the light-source device 40 shown in FIG. 5(a) according to the second embodiment, and a detailed description thereof will be omitted.

(Input System)

In the present embodiment, one system (the electrode lands 106 and 107) regarding input of two systems is assigned to first LED chips 102 while the other system (the electrode lands 108 and 109) is assigned to second LED chips 103. As described above, it is possible to flexibly cope with a case with different chip characteristics by using separate input systems for signals (signal input systems).

With the above-described configuration, a first light emitting diode and a different light emitting diode have different input system, and an input signal can be adjusted in accordance with characteristics of the diodes. The life and efficiency can be enhanced by maximizing the performance of each diode.

Advantageous Effects

Easiness on a human eye that is one of advantageous effects of the light-source devices 10 to 60 according to the above-described embodiments will be described below with reference to the graph in FIG. 8.

Figure 8:
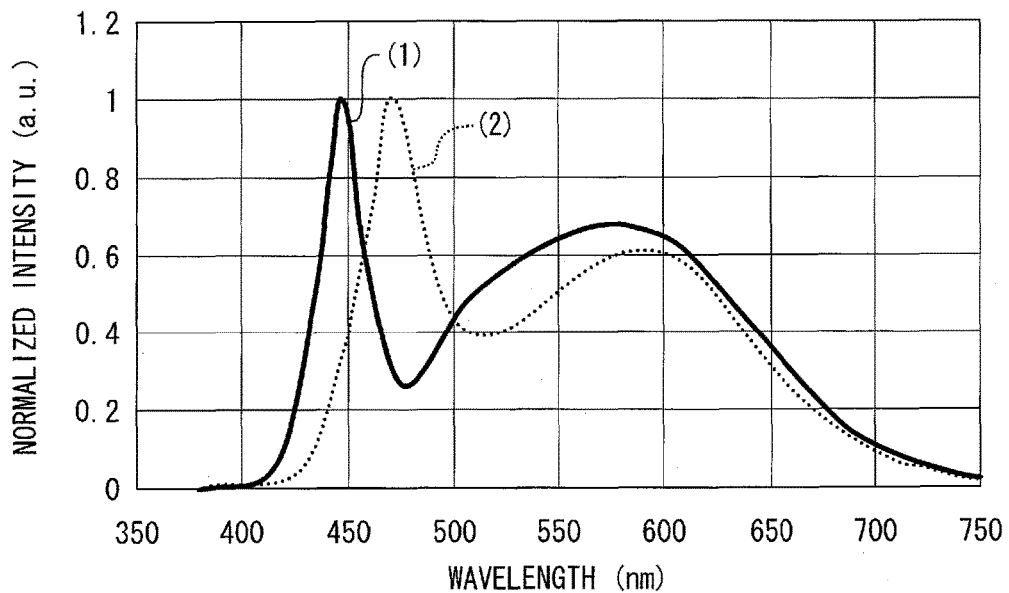
FIG. 8 is a graph showing the relationships between wavelength and normalized intensity in the light-source device shown in FIG. 7 and a conventional light-source device.

The graph in FIG. 8 shows case (1) where only a light emitting diode with a peak wavelength of 450 nm is used and case (2) where a light emitting diode (the second LED chip 103) with a peak wavelength of 450 nm and a light emitting diode (the first LED chip 102) with a peak wavelength of 470 nm are used in combination (the third to fifth embodiments), both of which are at a color temperature of 5000 K.

It can be seen from the graph in FIG. 8 that, even at the same color temperature, the amount of 415- to 460-nm components is smaller in case (2) than in case (1). That is, there are less 415- to 460-nm components which have an adverse impact on an eye in case (2), and case (2) can be said to be easier on a human eye.

From this, the light-source devices 10 and 20 according to the first and second embodiments, in particular, do not use the second LED chip 103 with a peak wavelength of 415 nm to 460 nm and can be said to be easy on a human eye.

High-efficiency emission that is one of advantageous effects of the present invention will be described below with reference to the graph in FIG. 9.

Figure 9:
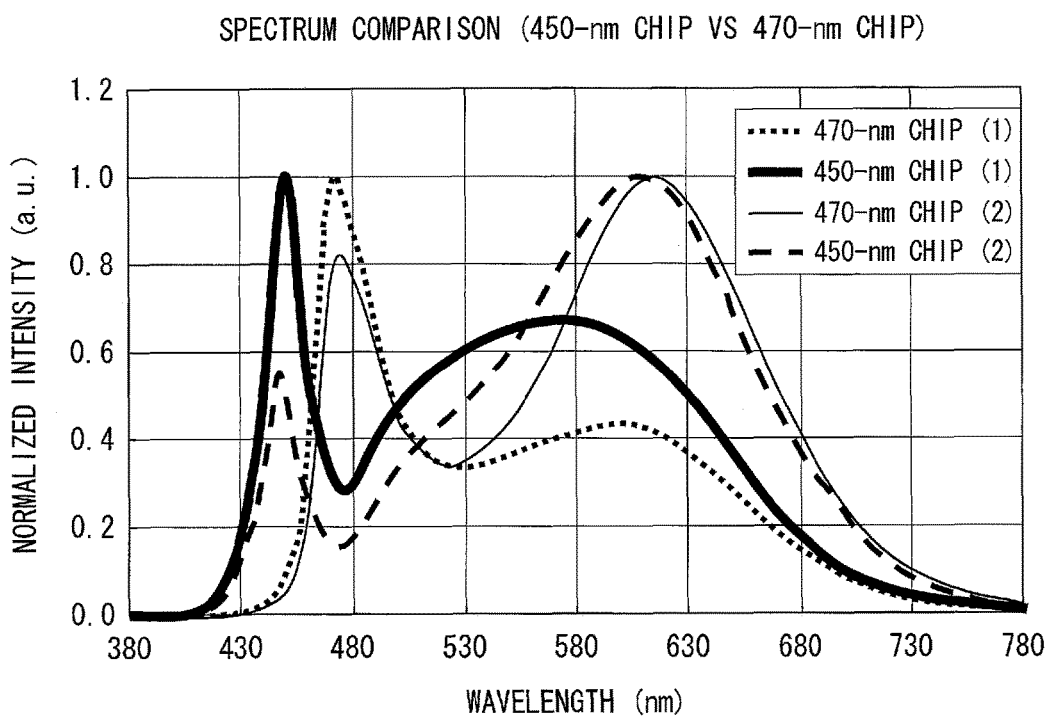
FIG. 9 is a graph showing relationships between wavelength and normalized intensity which vary for different chip wavelengths.

The graph in FIG. 9 shows, for each color temperature, emission spectrums of LEDs with different peak wavelengths (450- or 470-nm LED chips) sealed in almost the same amount of resin, into which phosphors are kneaded in the same compounding ratio. Two devices are formed with sealed-in phosphor amounts which produce white of 3000 K or 5000 K in LEDs using a 450-nm LED chip. $Sr_xCa_{1-x}AlSiN_3:Eu^{2+}$ is used as a red phosphor to be kneaded into the resin, and $Lu_3Al_5O_{12}:Ce^{3+}$ is used as a green phosphor. Four types of devices thus formed are referred to as 470-nm chip (1), 450-nm chip (1), 470-nm chip (2), and 450-nm chip (2) in the graph shown in FIG. 9.

Here, 470-nm chip (1) is obtained by sealing a 470-nm chip with a sealed-in phosphor amount which produces white of 5000 K in an LED using the 450-nm LED chip. 450-nm chip (1) is obtained by sealing a 450-nm chip with the sealed-in phosphor amount that produces white of 5000 K in an LED using the 450-nm LED chip. 470-nm chip (2) is obtained by sealing a 470-nm chip with a sealed-in phosphor amount which produces white of 3000 K in an LED using the 470-nm LED chip. 450-nm chip (2) is obtained by sealing a 450-nm chip with the sealed-in phosphor amount that produces white of 3000 K in an LED using the 450-nm LED chip.

It can be seen from the graph in FIG. 9 that, at the same color temperature, a 470-nm LED chip (470-nm chip (1) or (2)) has less green components (500 to 580 nm, particularly around 530 to 560 nm) than a 450-nm LED chip (450-nm chip (1) or (2)), and excitation efficiency for $Lu_3Al_5O_{12}:Ce^{3+}$ is lower. Thus, in the third to fifth embodiments, the second LED chip 103 with a peak wavelength of 415 nm to 460 nm high in excitation efficiency for $Lu_3Al_5O_{12}:Ce^{3+}$ is provided in addition to the first LED chip 102 with a peak wavelength of 460 nm to 500 nm low in excitation efficiency for $Lu_3Al_5O_{12}:Ce^{3+}$ in order to compensate for the excitation efficiency for $Lu_3Al_5O_{12}:Ce^{3+}$. As described above, a combination of LED chip wavelengths and phosphors is preferably selected in view of an LED chip wavelength to be used in a light-source device and phosphor excitation characteristics such that conditions are optimum. A combination of LED chips and phosphors is not limited to the above-described one. Additionally, one of a green phosphor and a red phosphor may be omitted or a plurality of green phosphors and a plurality of red phosphors may be simultaneously used.

Thus, the invention according to the third to fifth embodiments can implement a light-source device easy on a human eye and capable of high-efficiency emission.

[Manufacture of Light-Source Device]

A method for manufacturing the light-source devices according to the first to fifth embodiments will be described below.

A manufacturing process for a light-source device is divided into three main sub-processes. That is, the manufacturing process includes a light emitting element mounting process, a second light reflection resin layer (dam ring) formation process, and a sealing resin formation process.

In the following description of the manufacturing process, a description of a case where 20 light emitting elements (LED chips) are connected four in series and five in parallel will be given.

<Light Emitting Element Mounting Process>

Light emitting elements (the first LED chips 102, the second LED chips 103, the blue chips 131, the green chips 133, the red chips 132, or the like) are mounted on a substrate (the substrate 101). More specifically, a light emitting element is first die-bonded using an adhesive resin, such as silicone resin. In the description, 20 light emitting elements are arranged in a region surrounded by conductor wiring.

Each light emitting element is an LED chip having an outer shape rectangular in a top view and has a thickness of, for example, 100 to 180 μm. Two chip electrodes for an anode and a cathode (for the electrode lands 106 and 107) are provided on an upper rectangular surface of the light emitting element so as to face in a longitudinal direction. The light emitting elements are arranged almost in rows, and five rows with four light emitting elements per row are arranged.

Wire bonding is then performed using wires. At this time, for a light emitting element arranged adjacent to the conductor wiring, wire bonding is performed between the conductor wiring and a chip electrode. For adjacent light emitting elements without the conductor wiring therebetween, chip electrodes of the light emitting elements are directly connected by wire bonding. With this wire bonding, five direct circuit units, each having four light emitting elements connected in series, are connected in parallel between an anode electrode and a cathode electrode.

<Second Light Reflection Resin Layer Formation Process: Dam Ring Formation Process>

A light reflection resin frame is formed so as to cover the conductor wiring. More specifically, drawing is performed at a predetermined position while an alumina filler-containing silicone resin in liquid form is discharged through a nozzle having a round opening using, for example, a resin discharge device. The alumina filler-containing silicone resin is subjected to heat curing treatment under the conditions of curing temperature of 120° C. and curing time of one hour to form the light reflection resin frame (the dam ring 105). Note that the curing temperature and the curing time are merely exemplary and that the present invention is not limited to these.

The light reflection resin frame has a width of, for example, 0.9 mm. The height of a top portion of the light reflection resin frame is set to be higher than that of an upper surface of each light emitting element and is set to be higher than a wire (wire loop) connecting light emitting elements. This setting allows a sealing resin to be formed so as not to expose a light emitting element and a wire and allows protection of the components.

A wire connected to the conductor wiring is at least partially covered with the light reflection resin frame. This allows a reduction in wire exfoliation and prevention of wire exfoliation.

Although a nozzle having a round opening is used in the resin discharge device, the present invention is not limited to this. For example, a nozzle having an opening tailored to a drawing shape (an annular shape here) for the light reflection resin frame may be used. If such a nozzle is used, resin is discharged from the opening at one time, and a seamless, annular, light reflection resin frame can be fabricated in a short time. That is, a bulge at a joint is reduced, and a light reflection resin frame capable of reducing sealing resin leakage can be formed.

<Sealing Resin Formation Process>

A sealing resin (a phosphor-containing resin or a transparent resin containing no phosphor) is then formed on the substrate. More specifically, a phosphor-containing resin which is a transparent resin in liquid form with phosphors dispersed therein is injected so as to fill a region surrounded by the light reflection resin frame. After the injection of the phosphor-containing resin, the phosphor-containing resin is cured at a predetermined temperature for a predetermined time. With this injection and curing, a light emitting element and a wire are covered with the sealing resin and are protected. In the case of a transparent resin containing no phosphor, the transparent resin is formed through the same process as that for the phosphor-containing resin, and the only difference is the presence or absence of a phosphor in a resin.

The light-source devices 10 to 60 according to the first to fifth embodiments are basically manufactured through the above-described process. The light-source devices are somewhat different in configuration, and differences in the manufacturing process will be described below.

(1) As shown in FIG. 1, in the light-source device 10 according to the first embodiment, the first LED chips 102 are mounted on the substrate 101 in rows. In the sealing resin formation process, the first LED chips 102 are sealed in a phosphor-containing resin.

Figure 2:
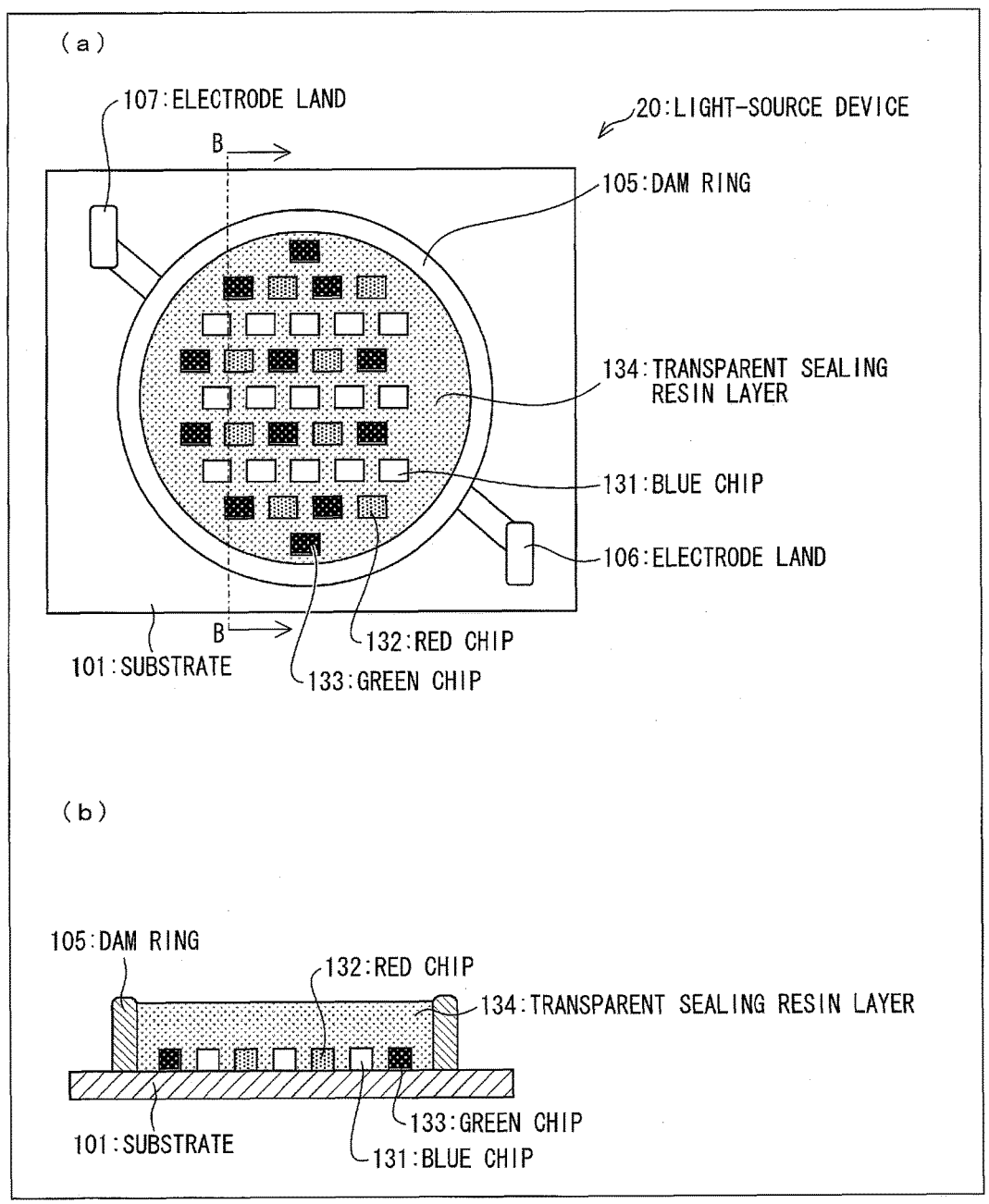
FIG. 2(a) is a plan view showing an example of the configuration of a light-emitting surface of a light-source device according to a second embodiment of the present invention.
FIG. 2(b) is a cross-sectional view on arrow B-B shown in FIG. 2(a).

(2) As shown in FIG. 2, in the light-source device 20 according to the second embodiment, the blue chips 131, the red chips 132, and the green chips 133 that are the same as the first LED chip 102 are mounted. In the sealing resin formation process, the chips are sealed in a resin into which no phosphor is kneaded.

Figure 3:
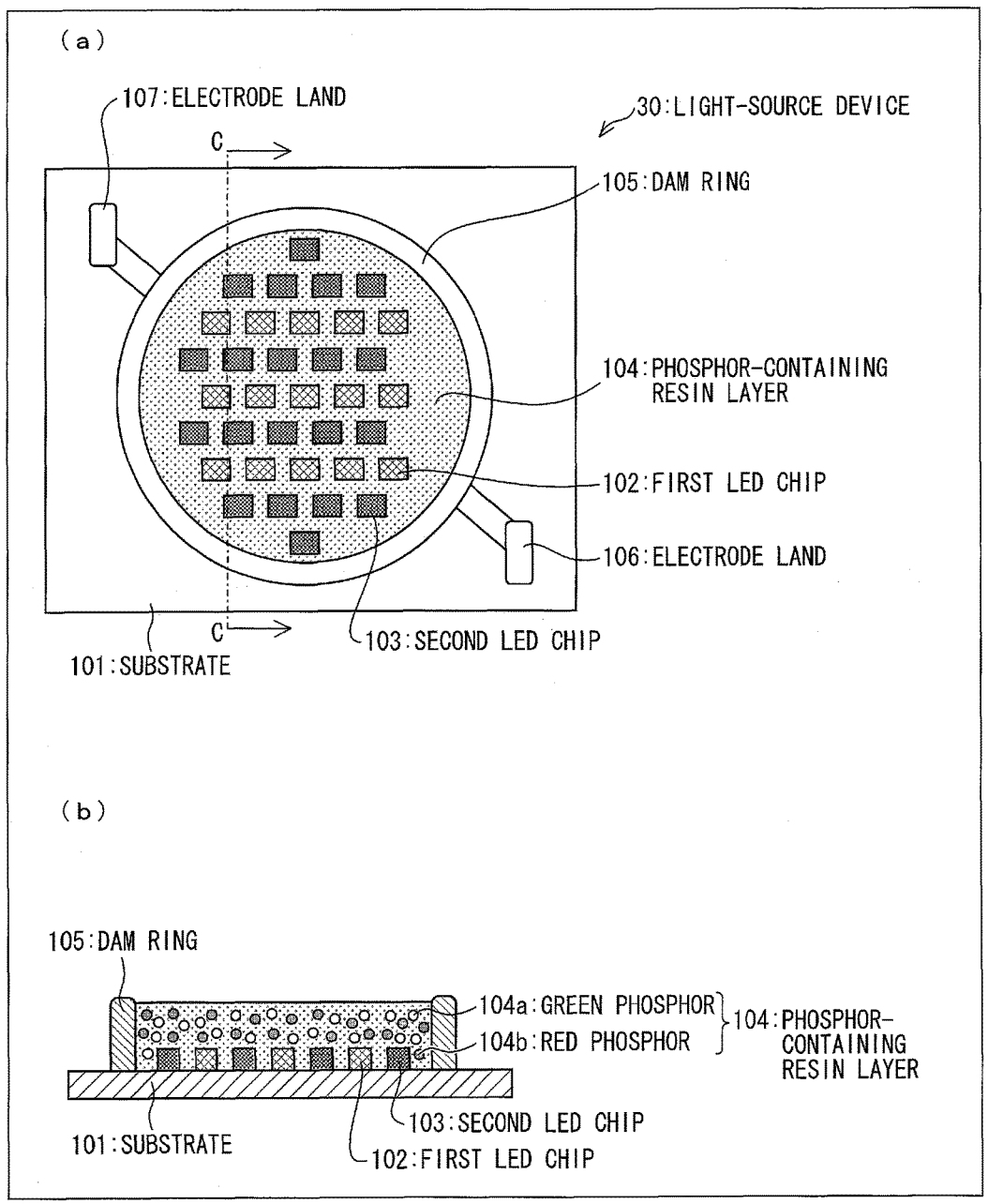
FIG. 3(a) is a plan view showing an example of the configuration of a light-emitting surface of a light-source device according to a third embodiment of the present invention.
FIG. 3(b) is a cross-sectional view on arrow C-C shown in FIG. 3(a).

(3) As shown in FIG. 3, in the light-source device 30 according to the third embodiment, the first LED chips 102 and the second LED chips 103 are mounted on the substrate 101 in rows. In the sealing resin formation process, the first LED chips 102 and the second LED chips 103 are sealed in the same type of phosphor-containing resin.

Figure 6:
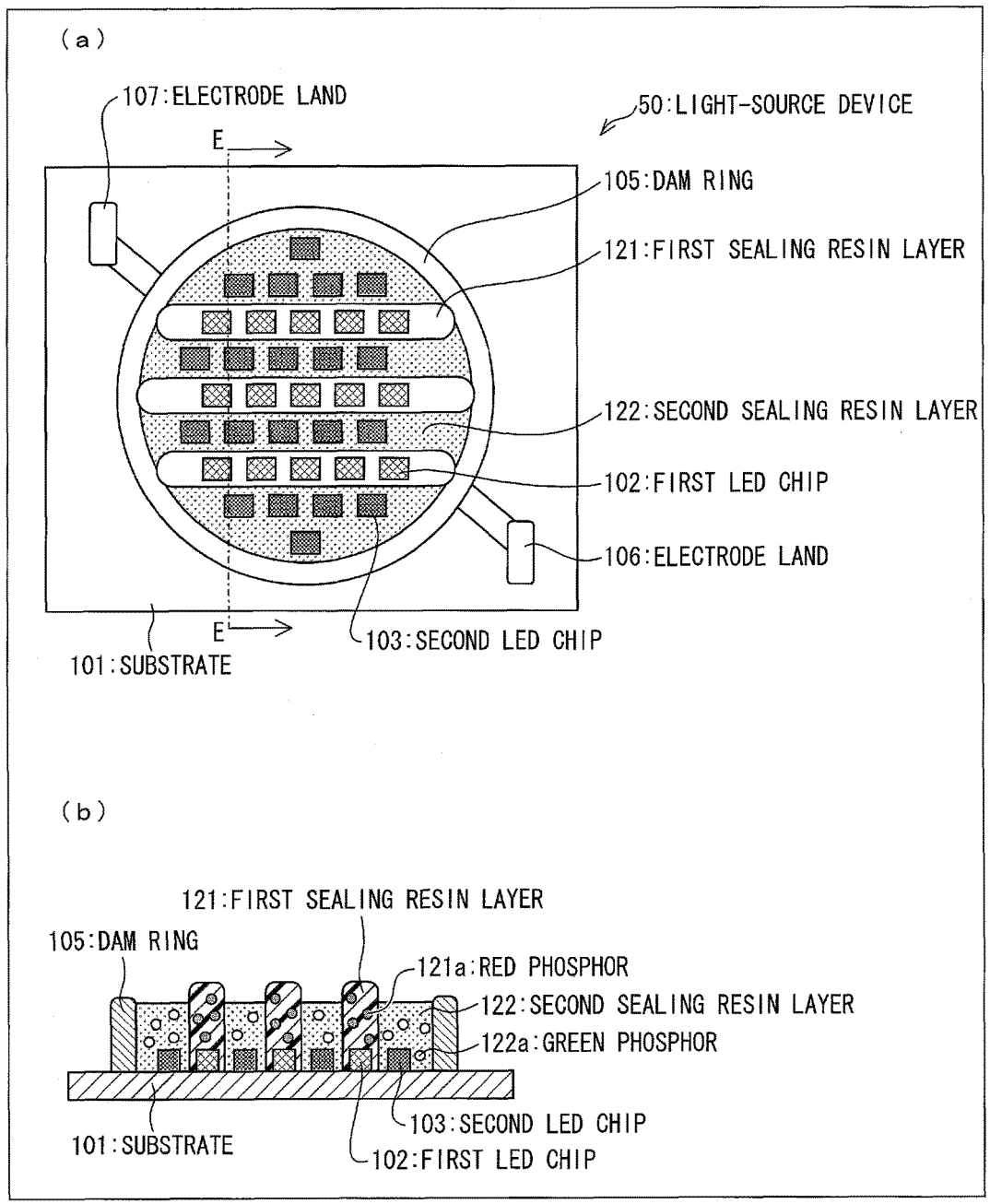
FIG. 6 shows a different light-source device with a sealing resin formed on the substrate shown in FIG. 4.

(4) As shown in FIGS. 5 and 6, in the light-source devices 40 and 50 according to the fourth embodiment, the first LED chips 102 and the second LED chips 103 are mounted on the substrate 101 in rows. In the sealing resin formation process, the first LED chips 102 are sealed in a highly thixotropic resin, into which no phosphor is kneaded, through the same drawing as for the dam ring 105, and the highly thixotropic resin is temporarily cured at 100° C. for 10 minutes. The second LED chips 103 are sealed in a resin into which a green phosphor and a red phosphor are kneaded (potting is performed for each region divided by the second LED chips 103). After that, the sealing resins are cured under original conditions.

(5) As shown in FIG. 7, in the light-source device 60 according to the fifth embodiment, the first LED chips 102 and the second LED chips 103 are mounted on the substrate 101 in rows, and the first LED chips 102 and the second LED chips 103 are connected so as to belong to different input systems. In the sealing resin formation process, the first LED chips 102 are sealed in a highly thixotropic resin, into which no phosphor is kneaded, through the same drawing as for the dam ring 105, and the highly thixotropic resin is temporarily cured at 100° C. for 10 minutes. The second LED chips 103 are sealed in a resin into which a green phosphor and a red phosphor are kneaded (potting is performed for each region divided by 470-nm chips). After that, the sealing resins are cured under original conditions. Note that the temporary curing temperature and the temporary curing time are merely exemplary and that the present invention is not limited to these.

As described above, each of the light-source devices 10 to 60 according to the first to fifth embodiments can be suitably used as a light-emitting device, such as a light source of an illumination device.

The light-source device according to each of the embodiments of the present invention is an LED package in which LEDs with different wavelengths are mounted on one substrate. The light-source device has the advantage over a device which emits white light with a plurality of LED packages arranged in terms of color mixing.

[Conclusion]

A light-source device (10, 20, 30, 40, 50, or 60) according to a first aspect of the present invention is a light-source device which emits white light using a light emitting diode, in which integrated light emission intensity from 460 nm to 500 nm is higher than integrated light emission intensity from 415 nm to 460 nm in an emission spectrum of the white light.

According to the above-described configuration, the integrated light emission intensity from 460 nm to 500 nm is higher than the integrated light emission intensity from 415 nm to 460 nm in the emission spectrum in the light-source device, and a main blue component of white light is light with 460 nm to 500 nm. For this reason, a component with a wavelength (415 nm to 460 nm) which has a larger impact on (poses a higher degree of hazard to) the retina of a human eye is not contained in a main blue component of white light emitted by the light-source device, and white light emitted from the light-source device with the above-described configuration is white light easy on a human eye.

A light-source device (10, 20, 30, 40, 50, or 60) according to a second aspect of the present invention in the first aspect includes a first light emitting diode (the first LED chip 102 or the blue chip 131) which emits blue light needed to produce white light, and a peak wavelength of the first light emitting diode is within a range of 460 nm to 500 nm.

According to the above-described configuration, the peak wavelength of the first light emitting diode that emits blue light needed to produce white light is within the range of 460 nm to 500 nm. The blue light hazard function (JIS T7330) can be made as small as about 0.62. Since a blue component of white light contains no component with a wavelength (415 nm to 460 nm) which has a large impact on (poses a high degree of hazard to) the retina of a human eye, white light emitted from the light-source device with the above-described configuration is white light easy on a human eye.

A light-source device (30, 40, 50, or 60) according to a third aspect of the present invention in the second aspect further includes a second light emitting diode (the second LED chip 103) which has a shorter peak wavelength than the peak wavelength of the first light emitting diode and excites a phosphor (the green phosphor 112a (122a) or the red phosphor 112b (121a)).

According to the above-described configuration, the second light emitting diode that has a shorter peak wavelength than the peak wavelength of the first light emitting diode and excites a phosphor is further included. Accordingly, the peak wavelength can enhance excitation efficiency for a phosphor which is low in the case of a range of 460 nm to 500 nm.

In a light-source device (30, 40, 50, or 60) according to a fourth aspect of the present invention in the third aspect, the peak wavelength of the second light emitting diode (the second LED chip 103) is within a range of 415 nm to 460 nm.

According to the above-described configuration, the peak wavelength of the second light emitting diode is within the range of 415 nm to 460 nm. The second LED chip can enhance excitation efficiency for a green phosphor which is low in the case of a peak wavelength within a range of 460 nm to 500 nm. This allows enhancement of emission efficiency of the whole light-source device.

In a light-source device (30, 40, 50, or 60) according to a fifth aspect of the present invention in the third or fourth aspect, the first light emitting diode (the first LED chip 102) and the second light emitting diode (the second LED chip 103) are sealed in a phosphor-containing sealing resin (the phosphor sealing resin layer 104) containing a phosphor which is excited by light emitted by the second light emitting diode.

According to the above-described configuration, the first light emitting diode and the second light emitting diode can be collectively sealed. This achieves simplification of a manufacturing process.

In a light-source device (40, 50, or 60) according to a sixth aspect of the present invention in the third or fourth aspect, the first light emitting diode (the first LED chip 102) and the second light emitting diode (the second LED chip 103) are sealed in different types of sealing resins (the first sealing resin layer 111 or 121 and the second sealing resin layer 112 or 122).

According to the above-described configuration, a sealing resin can be changed in accordance with a light emitting diode high in phosphor excitation efficiency. This allows implementation of a light-source device higher in phosphor excitation efficiency.

A light-source device (20) according to a seventh aspect of the present invention in the second aspect further includes a green light emitting diode (the green chip 133) which emits green light used at a time of emission of white light and a red light emitting diode (the red chip 132) which emits red light used at a time of emission of white light.

According to the above-described configuration, colors (blue, red, and green) used at a time of emission of white light are all achieved by light emitting diodes, and a sealing resin need not contain a phosphor. This eliminates the need for use of, in particular, a blue light emitting diode with a peak wavelength of 415 nm to 460 nm used to excite a green phosphor and allows emission of white light easy on a human eye.

In a light-source device (60) according to an eighth aspect of the present invention in any one of the second to seventh aspects, a signal input system for the first light emitting diode (the first LED chip 102) is different from a signal input system for a different light emitting diode (the second LED chip 103).

According to the above-described configuration, the first light emitting diode and the different light emitting diode have different input systems, and an input signal can be adjusted in accordance with characteristics of the diodes. The life and efficiency can be enhanced by maximizing the performance of each diode.

A light-emitting device according to a ninth aspect of the present invention includes a light-source device according to any one of the first to eighth aspects as a light source.

According to the above-described configuration, a light-source device which emits white light easy on a human eye can be implemented.

The present invention is not limited to the above-described embodiments, and various changes may be made within the scope of the claims. An embodiment based on a proper combination of technical means disclosed in different embodiments is encompassed in the technical scope of the present invention. Additionally, new technical features can be formed by combining the technical means disclosed in the embodiments.

Industrial Applicability

The present invention can be suitably used for various light sources, especially for an illumination light source and a backlight light source for a display, which need light easy on a human eye.

Reference Signs List

10 to 60 light-source device
101 substrate
102 first LED chip (first light emitting diode)
103 second LED chip (second light emitting diode)
104 phosphor-containing resin layer
105 dam ring
106 to 109 electrode land
111, 121 first sealing resin layer
112, 122 second sealing resin layer
112a, 122a green phosphor
112b, 121a red phosphor
131 blue chip (first light emitting diode)
132 red chip (red light emitting diode)
133 green chip (green light emitting diode)
134 transparent sealing resin layer

The invention claimed is:

1. A light-source device comprising:
a first light emitting diode which emits light having a peak wavelength within a range of 460 nm to 500 nm;
a second light emitting diode which emits light having a peak wavelength within a range of 415 nm to 460 nm; and
a sealing resin layer which comprises a phosphor which emits light in response to excitation by light emitted from the first light emitting diode and the second light emitting diode, wherein
integrated light emission intensity from 460 nm to 500 nm is higher than integrated light emission intensity from 415 nm to 460 nm in an emission spectrum of the light source device;
the emission spectrum is continuous in a visible light region; and
the phosphor includes a green phosphor and a red phosphor which emit green light and red light, respectively, in response to excitation made by blue light obtained through light emission by the second light emitting diode; and
on a substrate of the light-source device, a proportion of a total area occupied by the second light emitting diode is greater than a proportion of a total area occupied by the first light emitting diode.

* * * * *